United States Patent [19]

Wei et al.

[11] Patent Number: 5,751,161
[45] Date of Patent: May 12, 1998

[54] UPDATE SCHEME FOR IMPEDANCE CONTROLLED I/O BUFFERS

[75] Inventors: Shuran Wei, St. Paul; Randall Bach, Stillwater, both of Minn.

[73] Assignee: LSI Logic Corporation, Milpitas, Calif.

[21] Appl. No.: 626,272

[22] Filed: Apr. 4, 1996

[51] Int. Cl.[6] .................................................. H03K 17/16
[52] U.S. Cl. ............................ 326/30; 326/87; 326/50
[58] Field of Search ................................. 326/30, 83, 86, 326/87, 21, 49, 50, 121

[56] References Cited

U.S. PATENT DOCUMENTS

| | | | |
|---|---|---|---|
| 4,404,620 | 9/1983 | Sullivan et al. | 326/86 |
| 4,719,369 | 1/1988 | Asano et al. | 326/87 |
| 4,743,841 | 5/1988 | Takeuchi | 324/73 R |
| 4,970,454 | 11/1990 | Stambaugh et al. | 324/73.1 |
| 5,055,715 | 10/1991 | Inaba | 326/16 |
| 5,068,547 | 11/1991 | Gascoyne | 326/16 |
| 5,095,267 | 3/1992 | Merrill et al. | 324/158 R |
| 5,341,039 | 8/1994 | Fukumoto | 326/30 |
| 5,444,637 | 8/1995 | Smesny et al. | 364/556 |
| 5,448,182 | 9/1995 | Countrymen et al. | 326/30 |
| 5,481,208 | 1/1996 | Huang | 326/87 |
| 5,486,786 | 1/1996 | Lee | 327/378 |
| 5,559,447 | 9/1996 | Rees | 326/87 |
| 5,596,285 | 1/1997 | Marbot et al. | 326/30 |
| 5,621,335 | 4/1997 | Andresen | 326/87 |

*Primary Examiner*—Edward P. Westin
*Assistant Examiner*—Benjamin D. Driscoll
*Attorney, Agent, or Firm*—Westman, Champlin & Kelly, P.A.

[57] ABSTRACT

A method and circuit are disclosed for changing the output impedance of an impedance controlled buffer from an initial impedance to a final impedance, while minimizing data transmission errors. The buffer has a plurality of impedance control inputs, with each of the plurality of impedance control inputs receiving a corresponding one of a plurality of bits of a binary coded impedance control signal. The output impedance of the buffer is controlled as a function of a value of the impedance control signal. First, the value of the impedance control signal is changed from an initial value corresponding to the initial output impedance to an intermediate value corresponding to an intermediate output impedance which is less than the initial output impedance. Next, the intermediate value of the impedance control signal is changed to a final value corresponding to the final output impedance.

13 Claims, 5 Drawing Sheets

Fig. 2 _PRIOR ART_

UPDATE SCHEME FOR IMPEDANCE CONTROLLED I/O BUFFERS

BACKGROUND OF THE INVENTION

The present invention relates generally to impedance controlled buffers used to drive unterminated transmission lines, and more particularly, to a buffer impedance control signal update method which eliminates or minimizes data transmission errors occurring during impedance updating.

Impedance controlled buffers are used to drive unterminated transmission lines to transmit data to a load or receiver at the end of the transmission line. The output impedance of the buffer must be controlled, or "matched" to the line impedance, so that a clean, full amplitude data pulse from the buffer is obtained at the far end of the transmission line. The output impedance of the buffer must be controllable in this manner over all combinations of (1) device variations due to variations in the fabrication process; (2) supply voltage variations; and (3) operating temperature variations. Typically, the output impedance of the buffer is controlled by a four or five bit impedance control signal supplied to the buffer. The control signal drives enable pins of binary weighted drivers in the buffer, thereby adjusting the output impedance of the buffer. Usually, the higher the value of the binary impedance control signal, the lower the output impedance of the buffer will be.

In real time applications, data transmission errors can occur when the output impedance of the buffer is updated in response to a change in temperature or a change in supply voltage. The data transmission errors typically occur during the time when the various bits of the impedance control signal transition from one state or logic level to another. Frequently, there is a time difference, or "skew", between the transition times of the various bits of the control signal. The time difference or skew between the various bits of the control signal results in the buffer having an unintended intermediate output impedance, instead of transitioning directly from its initial output impedance to its final intended output impedance. If the intermediate output impedance of the driver is larger than the original output impedance, a positive error pulse will be generated at the output of the buffer for a negative going output transition. After a delay equal to the transmission time of the transmission line, a positive error pulse with double the amplitude of the amplitude at the buffer output will appear at the end of the transmission line. This latter pulse can cause a false transition of the load or receiver, resulting in a data transmission error.

Therefore, there is a need for a method of updating the impedance of an impedance controlled buffer which eliminates data transmission errors resulting from the delay which exists between transition times of the bits of the buffer impedance control signal.

SUMMARY OF THE INVENTION

The present invention includes a method and circuit for changing the output impedance of an impedance controlled buffer from an initial impedance to a final impedance, while minimizing data transmission errors. The buffer has a plurality of impedance control inputs, with each of the plurality of impedance control inputs receiving a corresponding one of a plurality of bits of a binary coded impedance control signal. The output impedance of the buffer is controlled as a function of a value of the impedance control signal. First, the value of the impedance control signal is changed from an initial value corresponding to the initial output impedance to an intermediate value corresponding to an intermediate output impedance which is less than the initial output impedance. Next, the value of the impedance control signal is changed to a final value corresponding to the final output impedance.

DETAILED DESCRIPTION OF THE PREFERRED EMBODIMENTS

Figure 1:
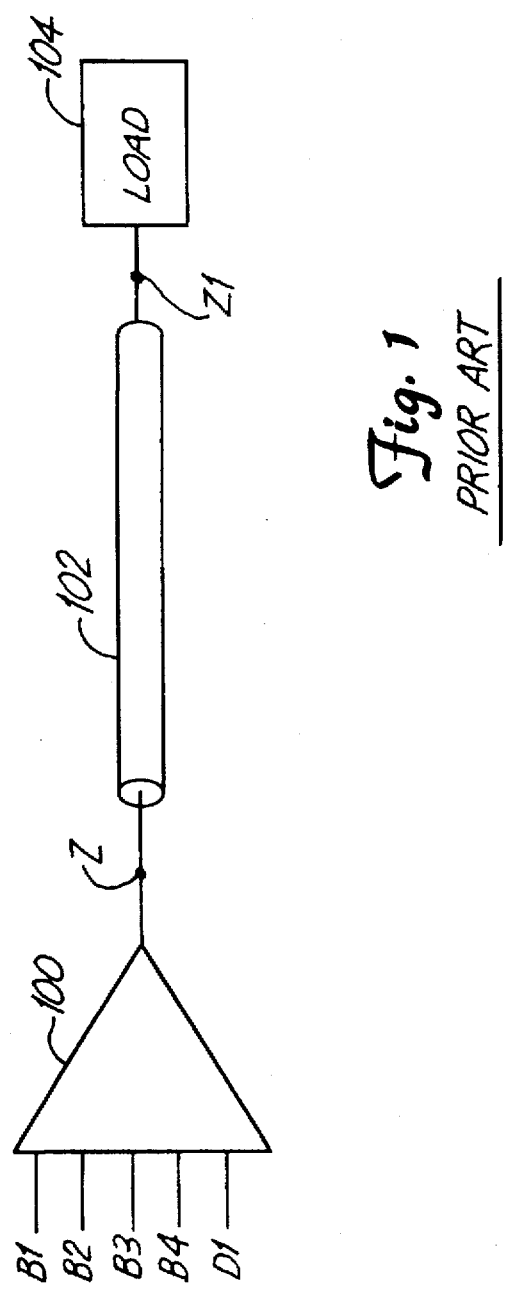
FIG. 1 is a diagrammatic view of a conventional impedance controlled buffer used to drive a load across a transmission line.

FIG. 1 illustrates an impedance controlled buffer of the type with which the impedance control signal update method of the present invention can be used to eliminate or minimize false transition type data transmission errors. Buffer 100 includes data input D1 and output Z. The output signal on output Z is provided by buffer 100 as a function of the value of the signal provided to data input D1. As shown in FIG. 1, buffer 100 includes four control signal inputs B1, B2, B3 and B4 which receive four bits of an impedance control signal. Depending upon the value of the four bit binary coded impedance control signal provided to inputs B1–B4 of buffer 100, the impedance of output Z is controlled. Typically, the larger the value of the four bit binary coded control signal, the lower the output impedance of buffer 100 will be.

The four bit impedance control signal provided to buffer 100 is used to control or match the output impedance of buffer 100 to the impedance of transmission line 102 over all combinations of supply voltage and operating temperature so that a clean, full amplitude data pulse from buffer output Z is obtained at load or receiver 104 positioned at point Z1 at the far end of transmission line 102. In addition to changing the output impedance in response to changes in voltage and/or temperature, the impedance control signal is used to match the output impedance of a particular buffer 100 to transmission line 102 regardless of variations in the particular buffer's characteristics caused by variations in the fabrication process used to make the buffer.

Figure 2:
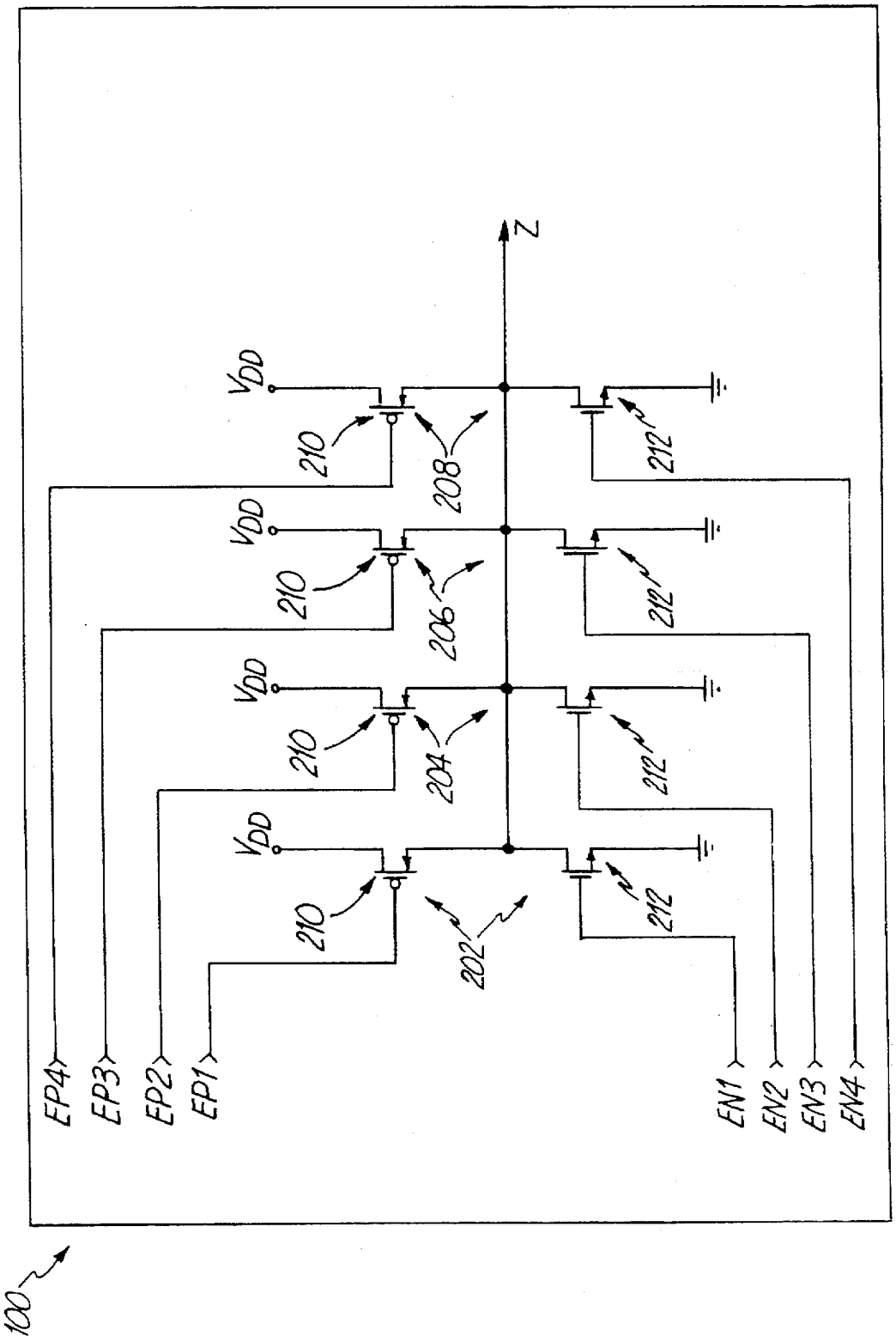
FIG. 2 is a simplified circuit diagram of a typical impedance controlled I/O buffer of a type to which the present invention applies.

FIG. 2 is a simplified circuit diagram of a typical controlled impedance I/O buffer which can be used in buffer 100 in the circuit illustrated in FIG. 1. The circuit diagram shown in FIG. 2 only illustrates the impedance control portion of buffer 100. Data input D1 and other portions of buffer 100 are omitted from FIG. 2 for ease of illustration. Buffer 100 illustrated in FIG. 2 includes four binary weighted drivers or drive circuits 202, 204, 206 and 208. Each of the four binary weighted drivers includes a P-channel transistor 210 connected in series with an N-channel transistor 212. The source electrode of P-channel transistor 210 of each pair is coupled to the drain electrode of N-channel transistor 212 of the pair. The drain electrode of each P-channel transistor 210 is coupled to supply voltage VDD. The source electrode of N-channel transistor 212 of each pair is coupled to ground. Output Z of buffer 100 is coupled to the source electrodes of P-channel transistors 210 and to the drain electrodes of N-channel transistors 212.

Each bit of the four-bit control signal (i.e., the bits provided to inputs B1, B2, B3 and B4 shown in FIG. 1) is separated into two signals, P-channel transistor enable signal EPn and N-channel transistor enable signal ENn (where n is representative of which of the four binary weighted drivers the particular enable signals correspond). Enable signals EP1 and EN1 correspond to first binary weighted driver 202. Enable signals EP2 and EN2 correspond to second binary weighted driver 204. Enable signals EP3 and EN3 correspond to third binary weighted driver 206. Finally, enable signals EP4 and EN4 correspond to fourth binary weighted driver 208.

As is well known in the art, the size of the P-channel transistor and the N-channel transistor is different for each of binary weighted drivers 202, 204, 206 and 208. Thus, the output impedance of buffer 100 at output Z can be controlled by enabling or disabling various ones of binary weighted drivers 202, 204, 206 and 208 to adjust the total parallel impedance provided by the binary weighted drivers. For ease of illustration, the present invention is hereafter discussed with reference only to generic enable signals EN1, EN2, EN3 and EN4 corresponding to N-channel transistors 212 of binary weighted drivers 202, 204, 206 and 208. However, those of ordinary skill in the art will recognize that the present invention applies to drivers of the type illustrated in FIG. 2 which require two or more enable signals for each of the binary weighted drivers.

Figure 3:
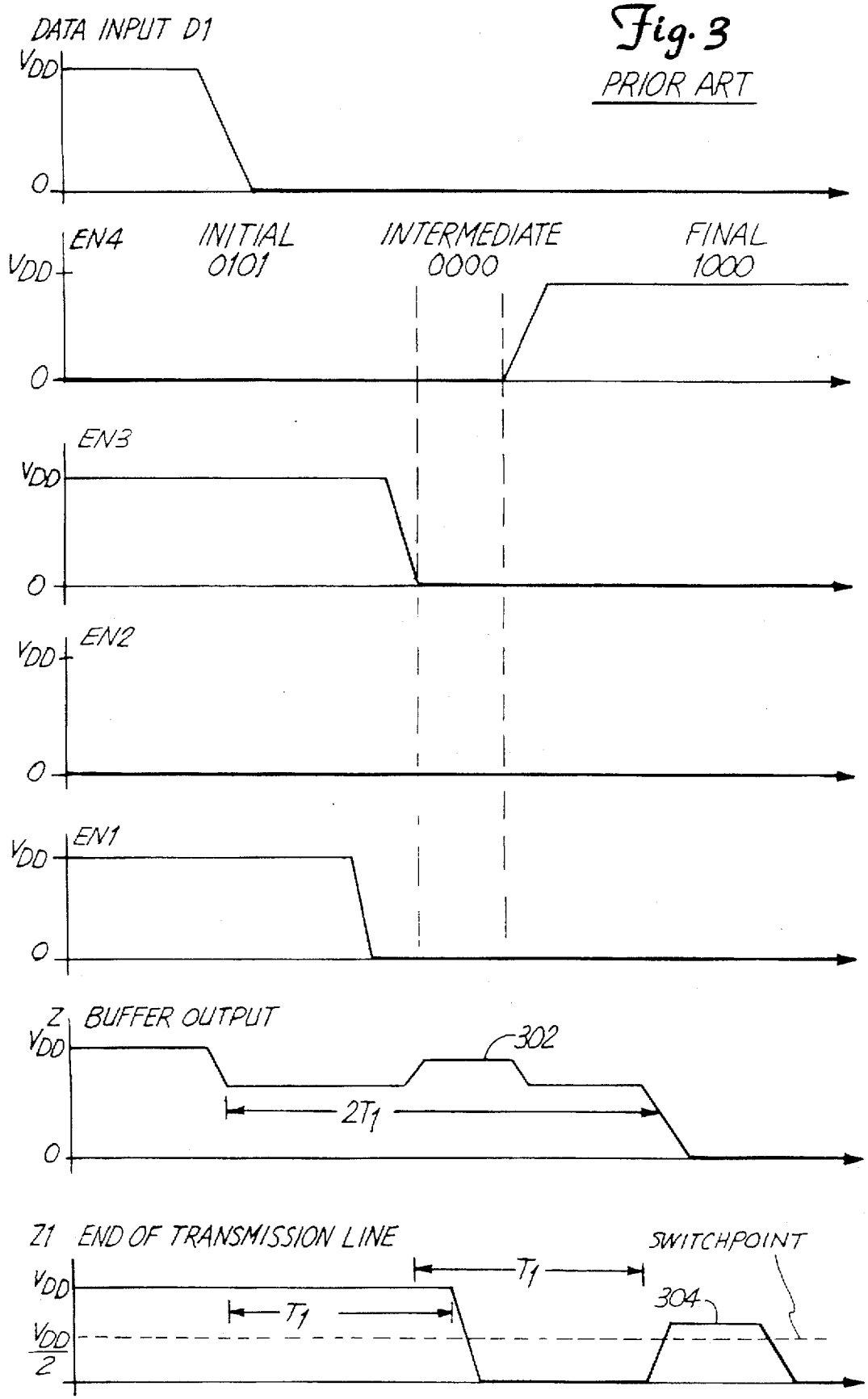
FIG. 3 is a timing diagram which illustrates false transition type data transmission errors occurring at the load or receiver at the end of the transmission line, and resulting from the unintended intermediate output impedance caused by the skew between the bits of the buffer impedance control signal.

FIG. 3 is a timing diagram which illustrates the occurrence of data transmission errors which can occur when the binary impedance control signal provided to buffer 100 transitions from an original value to a final value in order to adjust the output impedance level of the buffer. As illustrated in FIG. 3, when the signal at data input D1 of buffer 100 transitions from a high logic level to a low logic level, signals at buffer output Z and point Z1 at the end of transmission line 102 eventually transition to the low logic level as well. However, during the transition of buffer output Z and of point Z1, one or more unintended intermediate values of the binary impedance control signal are realized.

Enable input or signals EN1, EN2, EN3 and EN4 are included in FIG. 3 to illustrate the occurrence of an intermediate value of the impedance control signal, and thus of an intermediate value of the output impedance of buffer 100. In the example illustrated in FIG. 3, during the time period designated as the "INITIAL" time period, the binary coded impedance control signal has a value of 0101 (EN4=0, EN3=1, EN2=0 and EN1=1). Shortly before the time period designated as the "INTERMEDIATE" time period in FIG. 3, a change in temperature or supply voltage necessitated that the binary impedance control signal change from its initial value of 0101 to a final value of 1000 in order to match the output impedance of buffer 100 to the impedance of transmission line 102. Because of different path lengths and loads, the various bits (i.e., EN1, EN2 , EN3 and EN4) of the binary impedance control signal transition to their final values at different times. As shown in FIG. 3, bits EN1 and EN3 transition from their high logic level states to their low logic level states before bit EN4 transitions from its low logic level state to its high logic level state. The result is an unintended intermediate binary impedance control signal value of 0000.

Since the value of the intermediate impedance control signal is less than the value of the initial impedance control signal, the intermediate output impedance will be greater than the initial output impedance. When the intermediate output impedance of driver 100 is larger than the original output impedance, positive pulse 302 can occur at output Z. After a time period equal to the transmission time T1 of transmission line 102, positive pulse 304, with double the amplitude of pulse 302, appears at point Z1 at the end of transmission line 102. If pulse 304 has an amplitude which is greater than the amplitude of the switch point of load or receiver 104 (typically VDD/2), a false transition error will occur.

Figure 4:
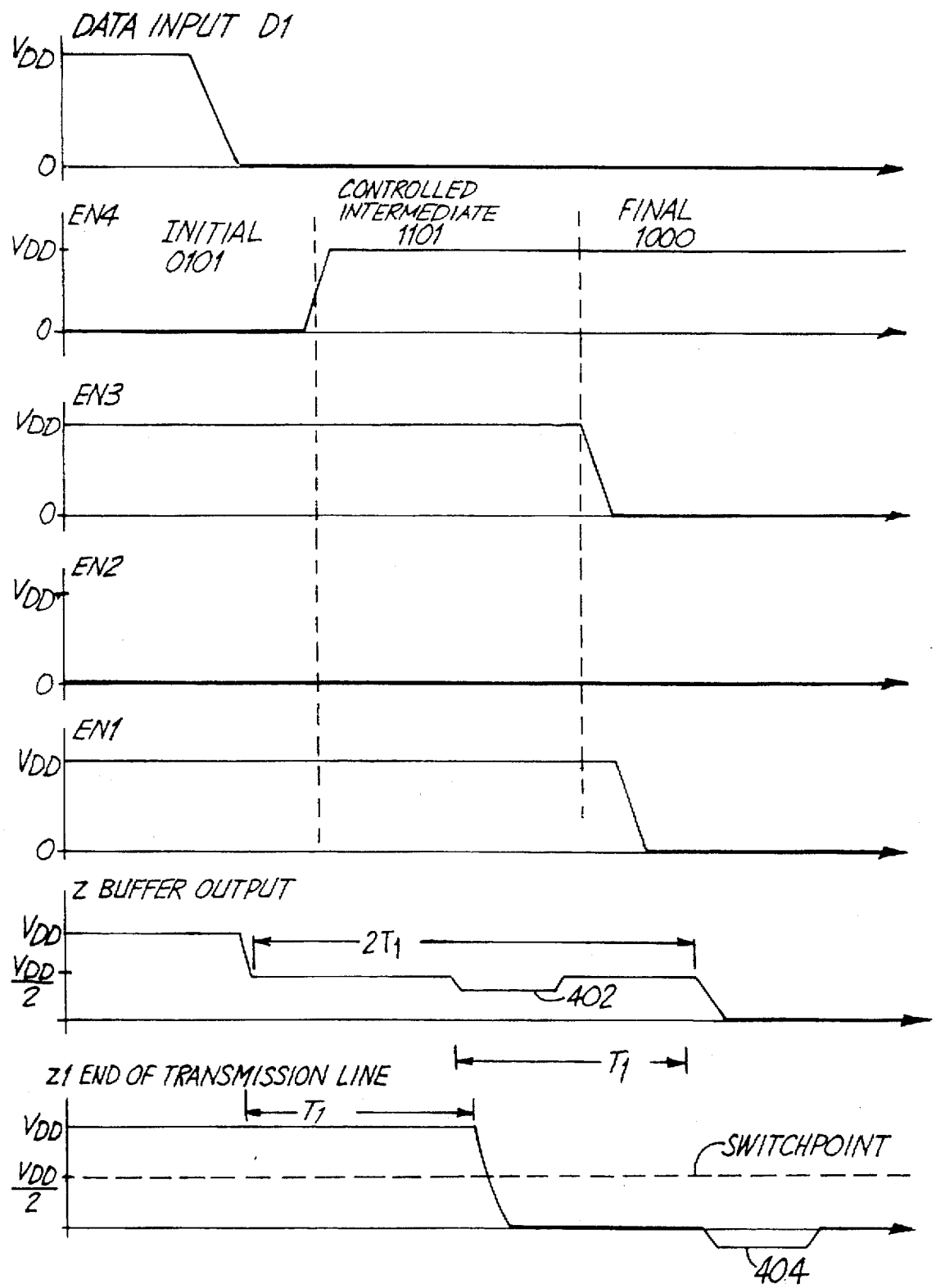
FIG. 4 is a timing diagram illustrating the update sequence or method of the present invention which minimizes the occurrence of false transition type data transmission errors, at the load or receiver located at the end of the transmission line, during the buffer's intermediate output impedance stage.

FIG. 4 is a timing diagram which illustrates an impedance control signal update sequence or method for eliminating or minimizing the occurrence of false transition type data transmission errors at the receiver during impedance updating of buffer 100. The update method of the present invention is illustrated by way of the example of FIG. 3 in which the binary impedance control signal is transitioning from an initial value of 0101 to a final value of 1000 in order to match the output impedance of buffer 100 to transmission line 102. As in the example illustrated with reference to FIG. 3, the value of data input D1 transitions from its high logic level state to its low logic level state. Buffer output Z and point Z1 at the end of transmission line 102 each eventually transition from their respective high logic level states to their respective low logic level states. However, in accordance with the preferred embodiments of the present invention, in FIG. 4 the intermediate value of the impedance control signal is controlled so that the intermediate output impedance of buffer 100 is smaller than the original output impedance. In preferred embodiments of the present invention, this is accomplished by intentionally delaying or skewing certain bits of the impedance control signal such that bits of the control signal which are transitioning from the low logic level state to the high logic level state are allowed to change prior to the transitioning of bits of the impedance control signal which are changing from the high logic level state to the low logic level state.

In the example shown in FIG. 4, with the impedance control signal transitioning from an initial value of 0101 to a final value of 1000, the method of the present invention requires that enable signal EN4 transition from its low logic level state to its high logic level state prior to bits EN3 and EN1 transitioning from their high logic level states to their low logic level states. In general, any bits of the control signal which are to change from the low logic level state to the high logic level state are controlled to transition at a time near the beginning of the intermediate time period. Any bits of the control signal which are to change from the high logic level state to the low logic level state are controlled to transition at a time near the end of the intermediate time period. Thus, the controlled intermediate value of the impedance control signal is maintained higher than the initial value of the impedance control signal. Consequently, the output impedance of buffer 100 is controlled during the intermediate time period to be less than the output impedance during the initial time period.

With the intermediate output impedance being maintained at a value which is less than the initial output impedance, negative pulse 402 appears at output Z of buffer 100. After a time period equal to the transmission time T1 of transmission line 102, negative pulse 404 is generated at point Z1 at the receiver end of transmission line 102. However, negative pulse 404 does not cause a false transition error at receiver or load 104 because it is in a direction away from the logic level switch point of the receiver.

As can be seen from the above example, by intentionally "skewing" the bits of the impedance control signal to maintain the output impedance of buffer or driver 100 smaller in the intermediate time period than in the initial time period, false transition errors can be reduced or eliminated. This result is contrary to existing practice in the art in which unintentionally occurring skewing of the impedance control signal is considered undesirable.

Figure 5:
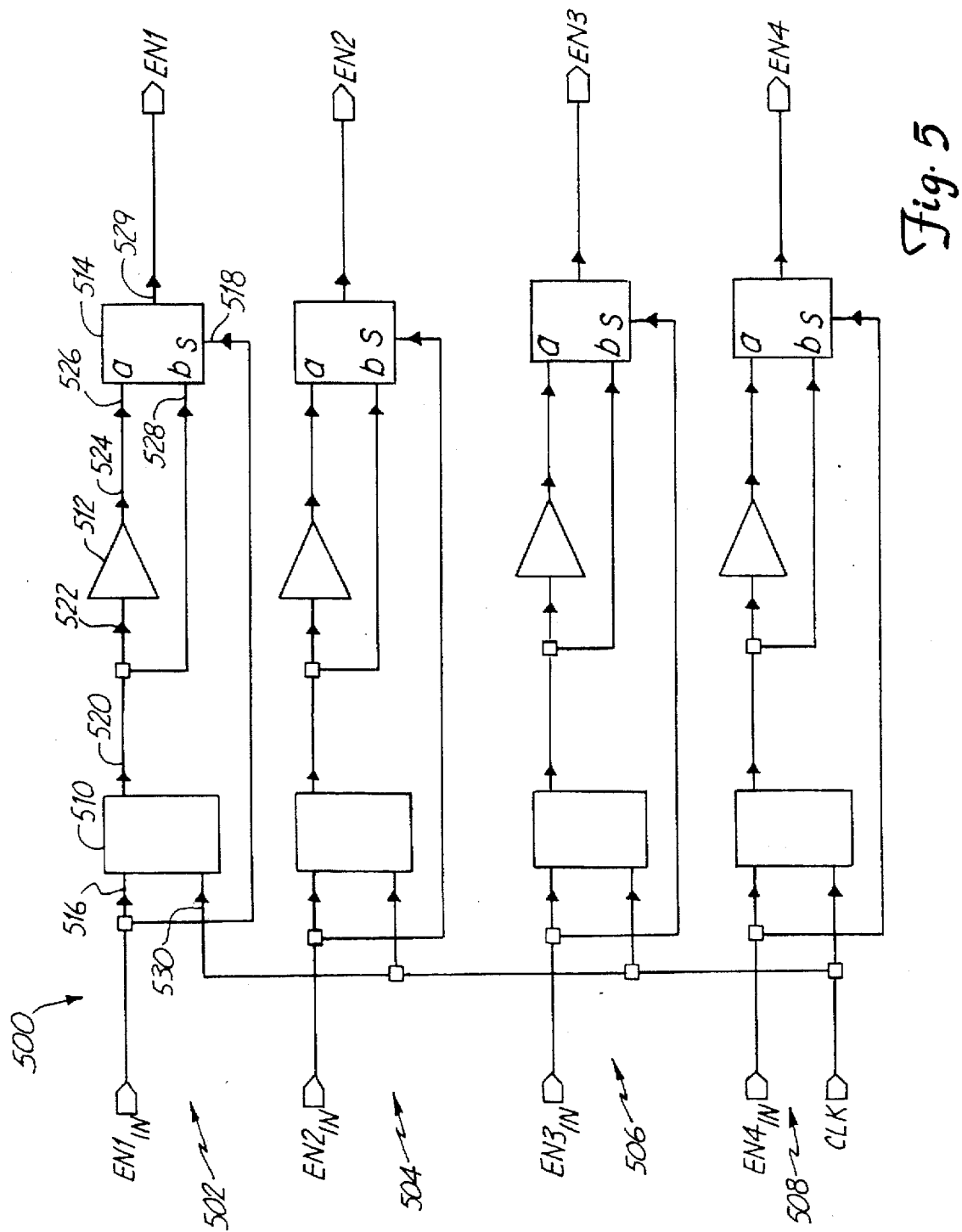
FIG. 5 is a logic circuit diagram illustrating a logic circuit adapted for implementing the update sequence or method of the present invention.

FIG. 5 illustrates logic circuit 500, in accordance with preferred embodiments of the present invention, for implementing the impedance control signal update sequence or method described above. Circuit 500 includes subcircuits 502, 504, 506 and 508. Each of subcircuits 502, 504, 506 and 508 corresponds to a particular one of the bits of the impedance control signal. Each of the subcircuits receives an input signal (i.e., $EN1_{IN}$, $EN2_{IN}$, $EN3_{IN}$ and $EN4_{IN}$, respectively) and provides as an output the corresponding bit of the impedance control signal (i.e., EN1, EN2, EN3 and EN4). In preferred embodiments, each of subcircuits 502, 504, 506 and 508 has the same components and design. Therefore, for ease of illustration, only subcircuit 502 corresponding to impedance control signal bit EN1 is discussed.

Subcircuit 502 includes flip-flop 510, delay element 512 and multiplexer or mux 514. Input signal $EN1_{IN}$, corresponding to the next desired value of impedance control signal bit EN1 (i.e., the final value of EN1 in the context of the example illustrated in FIG. 4) is provided to input 516 of flip-flop 510 and to select control input 518 of mux 514. Output 520 of flip-flop 510 is coupled to input 522 of delay element 512. Output 524 of delay element 512 is coupled to first input 526 of mux 514. Output 520 of flip-flop 510 is also coupled to second input 528 of mux 514. Output 529 of mux 514 provides the current input signal EN1 and has a value, depending upon the state of select input 518, equal to the value of the signal at one of mux inputs 526 and 528. Finally, clock signal CLK is coupled to clock input 530 of flip-flop 510.

In operation, subcircuit 502 of circuit 500 functions generally as follows. Input signal $EN1_{IN}$ is changed, if necessary, from the corresponding "initial" value of bit EN1 to the corresponding "final" value of bit EN1 as part of the process of updating the output impedance of buffer 100. Input signal $EN1_{IN}$ is provided to input 516 of flip-flop 510 and to select input 518 of mux 514. With a cycle of clock signal CLK at flip-flop clock input 530, input signal $EN1_{IN}$ is gated or transferred through to flip-flop output 520, and thus to input 522 of delay element 512 and to second input 528 of mux 514.

Delay element 512 adds a time delay to input signal $EN1_{IN}$ and provides the delayed signal at output 524 to mux input 526. With the added time delay, the signal at input 526 of mux 514 has a value equal to the initial value of bit EN1 during the intermediate time period, and then equal to the final value of bit EN1 during the final time period. If the final value of bit EN1 (i.e., the current value of input $EN1_{IN}$) is a high logic level, select input 518 of mux 514 causes the signal at second input 528 of mux 514 to be transferred to output 529. Thus, if the current value of input $EN1_{IN}$ (i.e., the final desired value of bit EN1) of the impedance control signal has a high logic level, this signal is transferred substantially immediately through mux 514 to output 529. However, if the current value of impedance control signal input bit $EN1_{IN}$ has a low logic level, then select input 518 of mux 514 causes input 526 to be transferred to mux output 529. Since the signal at input 526 of mux 514 has a value equal to the previous value of $EN1_{IN}$ (i.e., equal to the initial value of EN1) during the initial time period and a value equal to the current value of $EN1_{IN}$ (i.e., equal to the final value of EN1) during the final time period, this prevents EN1 from transitioning from a high logic level to a low logic level during the intermediate period.

Therefore, if the final value of impedance control signal bit EN1 is to be a high logic level signal, the final value the signal is almost immediately provided as impedance control signal input bit EN1. However, if the final value of impedance control input signal bit EN1 is to be a low logic level signal, then a delay is introduced by delay element 512 so that impedance control signal bit EN1 maintains its previous value until the end of the intermediate time period. In this manner, it is assured that the intermediate value of the impedance control signal is always equal to or greater than the initial value and the final value. Thus, the intermediate output impedance of buffer 100 is assured to be less than or equal to the initial output impedance and the final output impedance.

Although the present invention has been described with reference to preferred embodiments, workers skilled in the art will recognize that changes may be made in form and detail without departing from the spirit and scope of the invention. For example, while the present invention has been described with reference to a four bit impedance control signal, it is clear that more or less bits can be used. Also, circuitry such as circuit 500 can be included as an integral part of buffer 100 or, alternatively, it can be included upstream from buffer 100. Further, it is clear that the selective delay function provided by circuit 500 can be implemented using other circuits, or it can be implemented using programmable electronic devices instead of using discrete electrical components. Further yet, the present invention has been illustrated by way of examples in which enable inputs ENn are used to control the buffer impedance during a negative going data transition. However, it is clear that enable inputs EPn are used in the same manner to control the buffer output impedance during positive going data transitions.

What is claimed is:

1. A method of changing an output impedance of an impedance controlled buffer from an initial buffer output impedance to a final buffer output impedance, wherein an output of the buffer is coupled to a first end of a transmission line for transmitting data to a receiver coupled to a second end of the transmission line, the buffer having a plurality of impedance control inputs, with each of the plurality of impedance control inputs receiving a corresponding one of a plurality of bits of a binary coded impedance control signal, wherein the output impedance of the buffer is controlled as a function of a value of the impedance control signal, the method comprising:

changing the value of the impedance control signal from an initial value corresponding to the initial buffer output impedance to an intermediate value corresponding to an intermediate buffer output impedance, wherein the intermediate buffer output impedance is less than the initial buffer output impedance; and changing the value of the impedance control signal from the intermediate value corresponding to the intermediate buffer output impedance to a final value corresponding to the final buffer output impedance, wherein the intermediate buffer output impedance is less than the final buffer output impedance.

2. The method of claim 1, wherein each of the plurality of bits of the impedance control signal has an initial logic level during an initial time period in which the impedance control signal has the initial value, and wherein each of the plurality of bits of the impedance control signal has a final logic level during a final time period in which the impedance control signal has the final value, the step of changing the value of the impedance control signal from the initial value to the intermediate value comprising providing the impedance control signal during an intermediate time period such that individual ones of the plurality of bits of the impedance control signal have their respective final logic levels if their final logic levels are high logic levels, and such that individual ones of the plurality of bits of the impedance control signal have their respective initial logic levels if their respective final logic levels are low logic levels.

3. The method of claim 2, wherein providing the impedance control signal during the intermediate time period further comprises transitioning individual ones of the plurality of bits of the impedance control signal from their respective initial logic levels to their respective final logic levels at a time near the beginning of the intermediate time period if their respective final logic levels are high logic levels, and transitioning individual ones of the plurality of bits of the impedance control signal from their respective initial logic levels to their respective final logic levels at a time near the end of the intermediate time period if their respective final logic levels are low logic levels.

4. An impedance control apparatus for changing an output impedance of a buffer from an initial output impedance to a final output impedance, the buffer having a plurality of impedance control inputs, with each of the plurality of impedance control inputs adapted for receiving a corresponding one of a plurality of bits of an impedance control signal, wherein the output impedance of the buffer is controlled as a function of a value of the impedance control signal, the impedance control apparatus comprising:

means for changing the value of the impedance control signal from an initial value corresponding to the initial output impedance to an intermediate value corresponding to an intermediate output impedance, wherein the intermediate output impedance is less than the initial output impedance; and means for changing the value of the impedance control signal from the intermediate value corresponding to the intermediate output impedance to a final value corresponding to the final output impedance.

5. The impedance control apparatus of claim 4, wherein the means for changing the value of the impedance control signal from the intermediate value to the final value further comprises:

means for changing the value of the impedance control signal from the initial value to the final value, wherein the intermediate output impedance is less than the final output impedance.

6. The impedance control apparatus of claim 5 wherein each of the plurality of bits of the impedance control signal has an associated initial logic level during an initial time period in which the impedance control signal has the initial value, and wherein each of the plurality of bits of the impedance control signal has an associated final logic level during a final time period in which the impedance control signal has the final value, wherein the means for changing the value of the impedance control signal from the initial value to the intermediate value further comprises:

means for providing the impedance control signal during an intermediate time period between the initial and final time periods such that individual ones of the plurality of bits of the impedance control signal have their associated final logic levels during the intermediate time period if their associated final logic levels are high logic levels, and such that individual ones of the plurality of bits of the impedance control signal have their associated initial logic levels during the intermediate time period if their associated final logic levels are low logic levels.

7. The impedance control apparatus of claim 6, wherein the means for providing the impedance control signal during the intermediate time period further comprises:

means for changing individual ones of the plurality of bits of the impedance control signal from their associated initial logic levels to their associated final logic levels at a time near the beginning of the intermediate time period if their associated final logic levels are high logic levels.

8. The impedance control apparatus of claim 7, wherein the means for providing the impedance control signal during the intermediate time period further comprises:

means for changing individual ones of the plurality of bits of the impedance control signal from their associated initial logic levels to their associated final logic levels at a time near the end of the intermediate time period if their associated final logic levels are low logic levels.

9. A control circuit for controlling the change of an output impedance of a buffer from an initial output impedance to a final output impedance, the control circuit providing each of a plurality of bits of a binary coded impedance control output signal at a separate one of a plurality of control circuit outputs, the buffer having a plurality of impedance control buffer inputs, with each of the impedance control buffer inputs adapted for receiving one of the plurality of bits of the impedance control output signal from the plurality of control circuit outputs, wherein the output impedance of the buffer is controlled as a function of a value of the impedance control output signal from the control circuit, the control circuit comprising:

a plurality of control circuit inputs, wherein each of the plurality of control circuit inputs first receives a corresponding bit of an initial impedance control input signal during an initial time period, the initial impedance control input signal associated with the initial output impedance of the buffer, wherein each of the bits of the initial impedance control input signal have a corresponding initial logic level associated therewith, and wherein each of the plurality of control circuit inputs next receives a corresponding bit of a final impedance control input signal during an intermediate time period following the initial time period, wherein the final impedance control input signal is associated with the final output impedance of the buffer, wherein each of the bits of the final impedance control input signal have a corresponding final logic level associated therewith;

a plurality of delay elements, wherein an input of each of the plurality of delay elements is coupled to a separate one of the plurality of control circuit inputs and receives a corresponding bit of the initial impedance control input signal from the separate one of the control circuit inputs during the initial time period, each delay element introducing a delay in the corresponding bit of the initial impedance control input signal such that the corresponding bit of the initial impedance control input signal is provided at an output of the delay element during the intermediate time period following the initial time period;

a plurality of selection devices, wherein each of the plurality of selection devices has first and second inputs and a control circuit output, the first input of each of the plurality of selection devices being coupled to the output of a corresponding delay element and thereby receiving the corresponding bit of the initial impedance control input signal during the intermediate time period, the second input of each of the plurality of selection devices being coupled to a corresponding one of the plurality of control circuit inputs and thereby receives the corresponding bit of the final impedance control input signal during the intermediate time period, and wherein each of the plurality of selection devices provides the corresponding bit of the initial impedance control input signal at the corresponding control circuit output during the intermediate time period if the final logic level associated with the corresponding bit of the final impedance control input signal has a low logic level, and wherein each of the plurality of selection devices provides the corresponding bit of the final impedance control input signal at the corresponding control circuit output during the intermediate time period if the final logic level associated with the corresponding bit of the final impedance control input signal has a high logic level.

10. The control circuit of claim 9, wherein an intermediate impedance control output signal is provided at the plurality of control circuit outputs during the intermediate time period, the intermediate impedance control output signal causing the buffer to have an intermediate output impedance during the intermediate time period which is less than the initial output impedance.

11. The control circuit of claim 10, wherein each of the plurality of selection devices provides the corresponding bit of the final impedance control output signal at the corresponding control circuit output during a final time period following the intermediate time period, and thereby changes the output impedance of the buffer from the intermediate output impedance to the final output impedance.

12. The control circuit of claim 11, wherein each of the plurality of control circuit inputs includes a flip-flop having a flip-flop input and a flip-flop output, each flip-flop output being coupled to the corresponding delay element input and to the first input of the corresponding selection device, corresponding bits of the initial and final impedance control input signals being provided to the corresponding flip-flop inputs and gated through to the corresponding flip-flop outputs during clock cycles.

13. The control circuit of claim 11, wherein each of the plurality of selection devices includes a multiplexer.

* * * * *